(12) United States Patent
Vollkommer et al.

(10) Patent No.: US 11,574,779 B2
(45) Date of Patent: Feb. 7, 2023

(54) DUAL PUSH BUTTON SWITCH ASSEMBLY FOR A VEHICLE

(71) Applicant: Arens Controls Company, L.L.C., Arlington Heights, IL (US)

(72) Inventors: Roy F. Vollkommer, Arlington Heights, IL (US); Andrew A. Vogel, Arlington Heights, IL (US); Michael J. Nordengren, Arlington Heights, IL (US)

(73) Assignee: ARENS CONTROLS COMPANY LLC, Arlington Heights, IL (US)

( * ) Notice: Subject to any disclaimer, the term of this patent is extended or adjusted under 35 U.S.C. 154(b) by 24 days.

(21) Appl. No.: 16/655,974

(22) Filed: Oct. 17, 2019

(65) Prior Publication Data

US 2021/0118632 A1    Apr. 22, 2021

(51) Int. Cl.
| | |
|---|---|
| H01H 13/50 | (2006.01) |
| H01H 13/70 | (2006.01) |
| H01H 13/86 | (2006.01) |
| H05K 1/18 | (2006.01) |
| F16H 59/12 | (2006.01) |
| F16H 59/04 | (2006.01) |
| F16H 59/02 | (2006.01) |

(52) U.S. Cl.
CPC ........ H01H 13/7006 (2013.01); H01H 13/50 (2013.01); H01H 13/86 (2013.01); H05K 1/18 (2013.01); *F16H 59/0213* (2013.01); *F16H 59/044* (2013.01); *F16H 59/12* (2013.01); *F16H 2059/0221* (2013.01); *H01H 2221/022* (2013.01); *H01H 2225/008* (2013.01); *H01H 2225/01* (2013.01); *H01H 2225/03* (2013.01); *H01H 2231/026* (2013.01); *H05K 2201/10053* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 7,146,701 | B2* | 12/2006 | Mahoney | H01H 13/70 29/458 |
| 7,450,106 | B2* | 11/2008 | Fyke | G06F 3/0485 345/156 |
| 9,105,422 | B2* | 8/2015 | Liu | H01H 13/7073 |
| 10,298,234 | B2* | 5/2019 | Allgaier | H01H 9/042 |
| 10,347,441 | B2* | 7/2019 | Wu | H01H 13/85 |
| 10,475,606 | B2* | 11/2019 | Schmitz | H01H 25/002 |
| 2002/0061735 | A1* | 5/2002 | Wingett | H01H 25/041 455/575.1 |

(Continued)

Primary Examiner — Felix O Figueroa
(74) Attorney, Agent, or Firm — Pearne & Gordon LLP

(57) ABSTRACT

A dual push button switch assembly for a vehicle includes an elastic button being moveable between a first unactuated position and a second actuated position, an actuator that is movable between a first position and a second position, and first and second switches. When the elastic button is in the first unactuated position, a resilient dome biases the actuator into the first position, and when the elastic button is moved towards the second actuated position, a force applied to the elastic button is transmitted to the actuator to move the actuator towards the second position, and wherein as the actuator moves towards the second position, the first and second switches are activated.

6 Claims, 6 Drawing Sheets

(56) References Cited

U.S. PATENT DOCUMENTS

| | | | |
|---|---|---|---|
| 2002/0125112 A1* | 9/2002 | Takezawa | H01H 25/041 200/6 A |
| 2006/0100485 A1* | 5/2006 | Arai | A61B 1/015 600/159 |
| 2020/0204178 A1* | 6/2020 | Chen | G06F 3/0233 |

* cited by examiner

DUAL PUSH BUTTON SWITCH ASSEMBLY FOR A VEHICLE

FIELD OF THE INVENTION

This application relates generally to a push button switch assembly, and more particularly, to a dual push button switch assembly for a vehicle.

BACKGROUND OF THE INVENTION

Conventional means for selecting an operating mode of a vehicle include gear shifts which require a user to manually translate the entire gear shift from one location to another location in order to change the operating mode of the vehicle. Alternatively, switch assemblies may be used to select an operating mode of the vehicle. This greatly reduces the amount of time and energy necessary to operate the vehicle. Traditional switch assemblies include a mechanical spring to bias a button of the switch assembly into an unactuated position. However, the spring is incapable of providing sufficient feedback (to the user) that the button has been correctly actuated. The user is then unaware whether the operating mode associated with that button selection will commence.

Further, traditional switch assemblies include only a single switch associated with any given button. That is, when a user engages (i.e., moves) the button towards an actuated position, a single switch is activated which, in turn, sends a signal to a controller to perform the intended function associated with the button. Such a configuration (i.e., having only a single switch associated with a single button) fails to abide by new regulations set forth in the industry.

BRIEF SUMMARY OF THE INVENTION

In accordance with one aspect, there is provided a dual push button switch assembly for a vehicle. The dual push button switch assembly includes an elastic button being moveable between a first unactuated position and a second actuated position. The dual push button switch assembly also includes a resilient dome being moveable between a first normal position and a second depressed position. An actuator is positioned between the elastic button and the resilient dome and is movable between a first position corresponding to the first unactuated position of the elastic button and the first normal position of the resilient dome and a second position corresponding to the second actuated position of the elastic button and the second depressed position of the resilient dome. The resilient dome biasing the actuator towards the first position. The dual push button switch assembly additionally includes first and second switches.

The elastic button is moved towards the second actuated position when a predetermined force applied to the elastic button is transmitted to the actuator. When the actuator is in the second position, both the first and second switches are activated.

In accordance with another aspect, there is provided a dual push button switch assembly for a vehicle. The dual push button switch assembly includes a housing having a plurality of walls that collectively define an inner space. The dual push button switch assembly further includes an elastic button that is moveable between a first unactuated position and a second actuated position relative to the housing. A holder is disposed in the housing and includes a plurality of walls. At least one pivot slot is formed integral with a wall of the plurality of walls of the holder. Further, first and second through-holes are formed in a bottom of the holder. A printed circuit board is positioned within the housing and disposed adjacent the holder.

A first switch comprising a dome sensor is disposed on a surface of the printed circuit board and is peripherally surrounded by the first through-hole. A second switch comprising a hall sensor is disposed on the surface of the printed circuit board and extends into the second through-hole. A resilient dome is disposed on the surface of the printed circuit board and is located adjacent to the dome sensor. The resilient dome extends into the first through-hole, and the resilient dome is movable between a first normal position and a second depressed position.

The dual push button switch assembly also includes an actuator positioned between the elastic button and the resilient dome and pivotable between a first position corresponding to the first unactuated position of the elastic button and the first normal position of the resilient dome and a second position corresponding to the second actuated position of the elastic button and the second depressed position of the resilient dome. The actuator comprises a foot extending outwards therefrom and at least one pivot pin that engages the at least one pivot slot so as to pivot the actuator. The resilient dome biases the actuator towards the first position. A magnetic element is positioned on an end of the actuator that is opposite from the at least one pivot pin.

The elastic button is moved towards the second actuated position when a predetermined force applied to the elastic button is transmitted to the actuator. As the actuator pivots from the first position towards the second position, the foot slides across a surface of the resilient dome and moves the resilient dome to the second depressed position, thereby activating the first switch, and the hall sensor senses a change in the magnetic field of the magnetic element, thereby simultaneously activating the second switch.

DESCRIPTION OF EXAMPLE EMBODIMENTS

Figure 1:
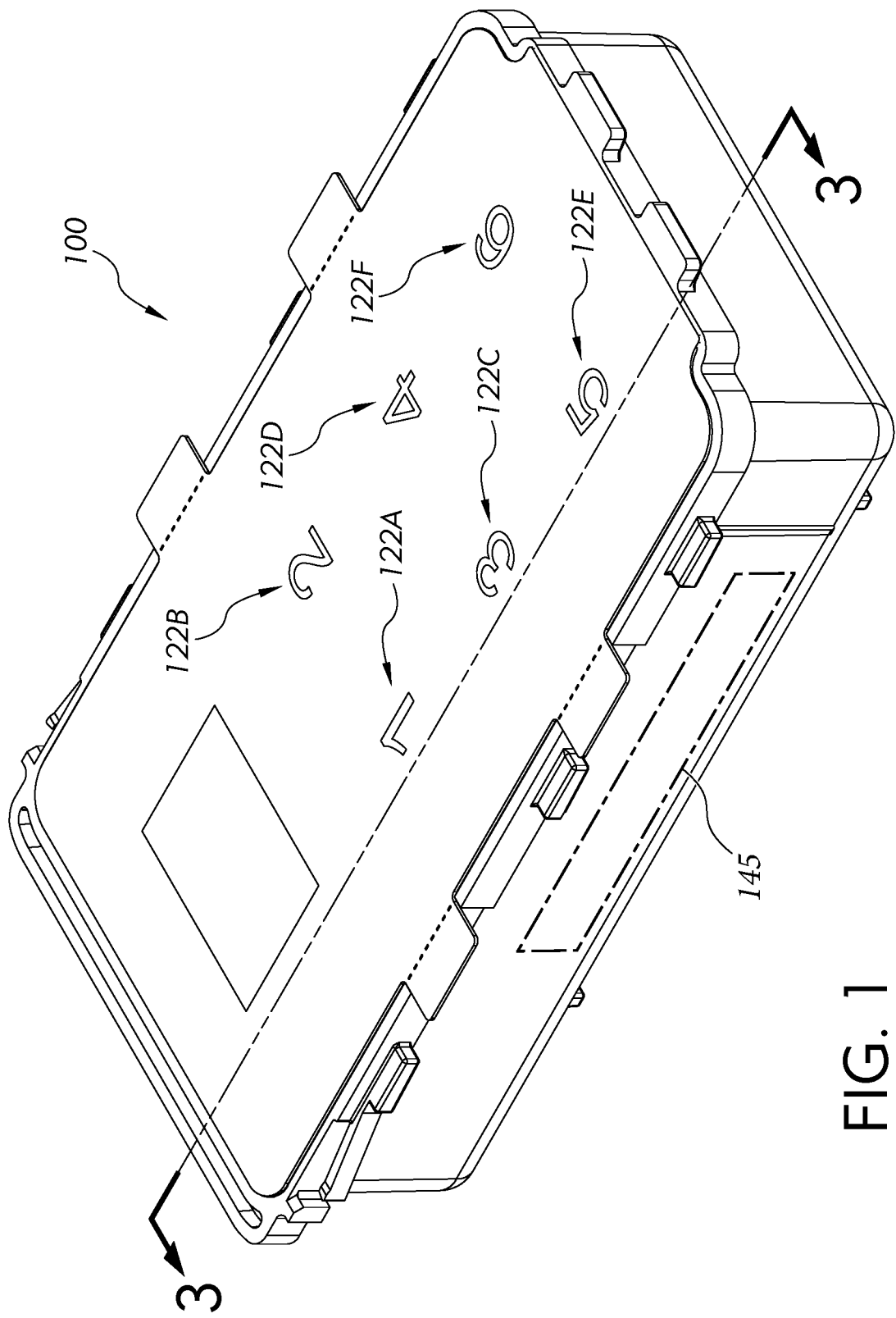
FIG. 1 is a perspective view of a dual push button switch assembly, according to the present invention.

Referring now to the drawings, FIG. 1 depicts a perspective view of a dual push button switch assembly 100. Specifically, the dual push button switch assembly 100 is to be employed in a vehicle (i.e., a means of transportation). The dual push button switch assembly 100 may be employed in vehicles such as: motor vehicles (e.g., cars, trucks, buses, motorcycles, tricycles, etc.); railed vehicles (e.g., trains, trams, etc.); watercrafts (e.g., ships, boats, jet Skis©, waverunners, etc.); amphibious vehicles (e.g., airboats, hovercrafts, etc.); aircrafts (e.g., airplanes, helicopters, etc.); and spacecrafts. It is to be understood that the dual push button switch assembly 100 may be employed in vehicles other than those that are specifically configured for transportation. That is, the dual push button switch assembly 100 may also be employed in industrial vehicles (e.g., excavating equipment, loaders, etc.).

Figure 2:
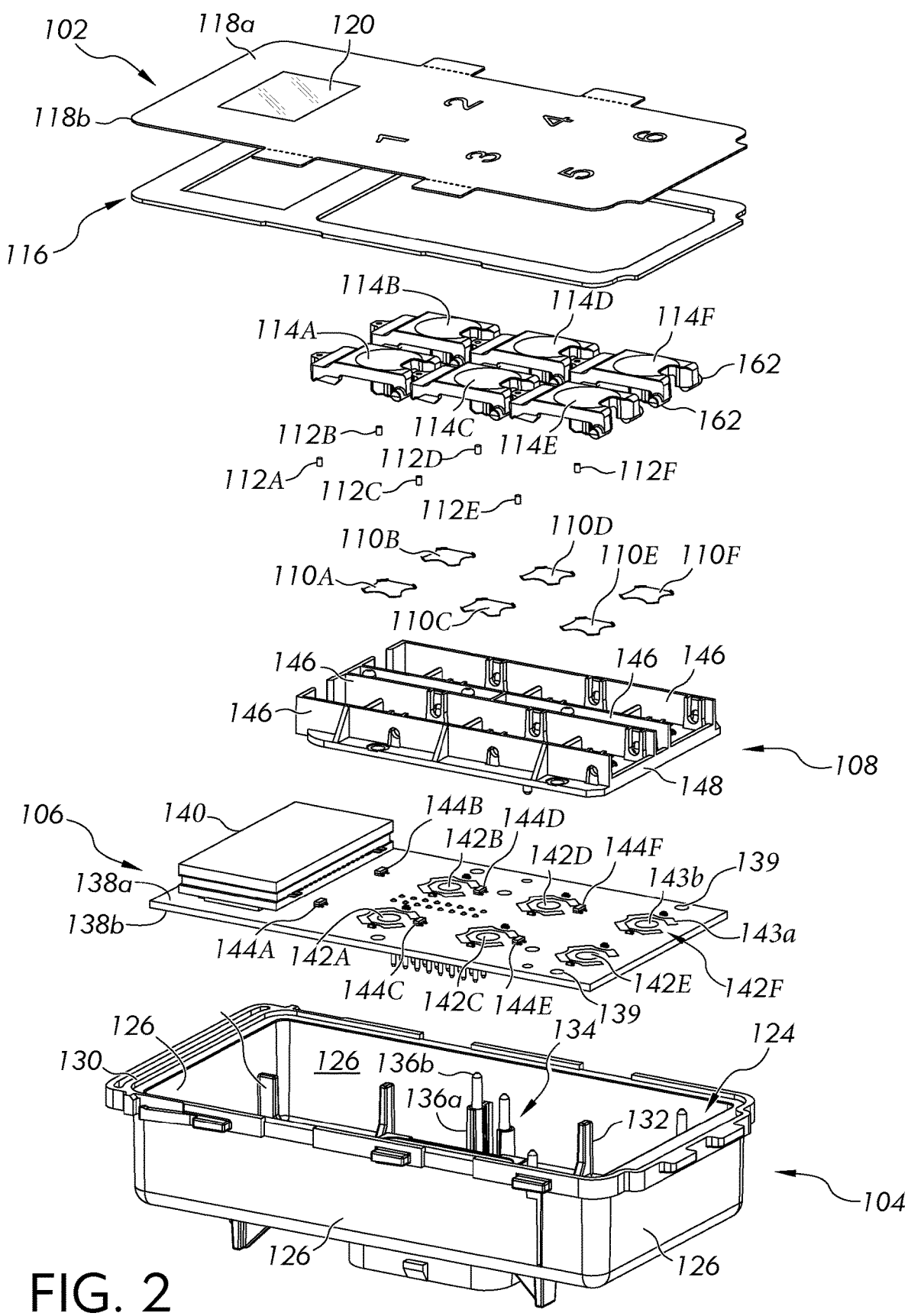
FIG. 2 is an exploded view of the dual push button switch assembly shown in FIG. 1.

With respect to FIG. 2, the dual push button switch assembly 100 is shown in an exploded view. As depicted the dual push button switch assembly 100 generally includes an overlay or keypad 102, a housing 104, a printed circuit board 106, a holder 108, a plurality of resilient domes 110A-110F, a plurality of magnetic elements 112A-112F, a plurality of actuators 114A-114F, and a gasket 116. When the dual push button switch assembly 100 is in an assembled position (i.e., as shown in FIG. 1), the gasket 116 provides a seal between the keypad 102 and the housing 104 such that ingress of foreign materials (e.g., food particles, liquid, dust, etc.) into the housing 104 is hindered.

The keypad 102 is in the shape of an elongated rectangle that is substantially planar (e.g., flat), and is manufactured from a resilient material. For example, the keypad 102 may be manufactured from thermoplastics (e.g., polybutylene terephthalate) or other materials of the like. The keypad 102 comprises first and second opposing surfaces 118a, 118b. In the embodiment shown, a window 120 is provided in an opening of the keypad 102 and is configured to permit a user to see an electronic display provided within the housing 104, as will be further discussed below. Specifically, the window 120 is transparent and affixed (e.g., glued) to one of the first and second opposing surfaces 118a, 118b. Alternatively, the window 120 can be integral with the keypad 102; for example, the window 120 may be positioned within a mold during manufacturing of the keypad 102 such that the keypad 102 is overmolded around the window 120.

Briefly moving back to FIG. 1, the keypad 102 further comprises a plurality of elastic buttons 122A-122F formed therewith. That is, each of the plurality of elastic buttons 122A-122F are formed integral with the other elastic buttons 122A-122F. Said differently, the plurality of elastic buttons 122A-122F are formed integral such that they are made from the same material, during a simultaneous manufacturing process. However, it is contemplated that each of the elastic buttons 122A-122F may be separate elastic pieces with respect to one another. Because each of the elastic buttons 122A-122F are manufactured from the same resilient material as the overall keypad 102, each elastic button 122A-122F is elastically deformable between a first, unactuated positon and a second, actuated position, as will be discussed further below.

While not shown, the dual push button switch assembly 100 can further include a faceplate, also in the shape of an elongated rectangle, and configured to be disposed over the first surface 118a of the keypad 102. Specifically, the faceplate can have a plurality of apertures (i.e., through-holes) formed therein, wherein each aperture is positioned with a corresponding one of the plurality of elastic buttons 122A-122F. In this manner, the faceplate would isolate each of the plurality of elastic buttons 122A-122F from one another to enhance a user's ability to accurately engage a desired one of the plurality of elastic buttons 122A-122F. The faceplate may also include symbols, letters, etc. for providing an indication to the user the purpose of each of the plurality of elastic buttons 122A-122F.

Figure 3:
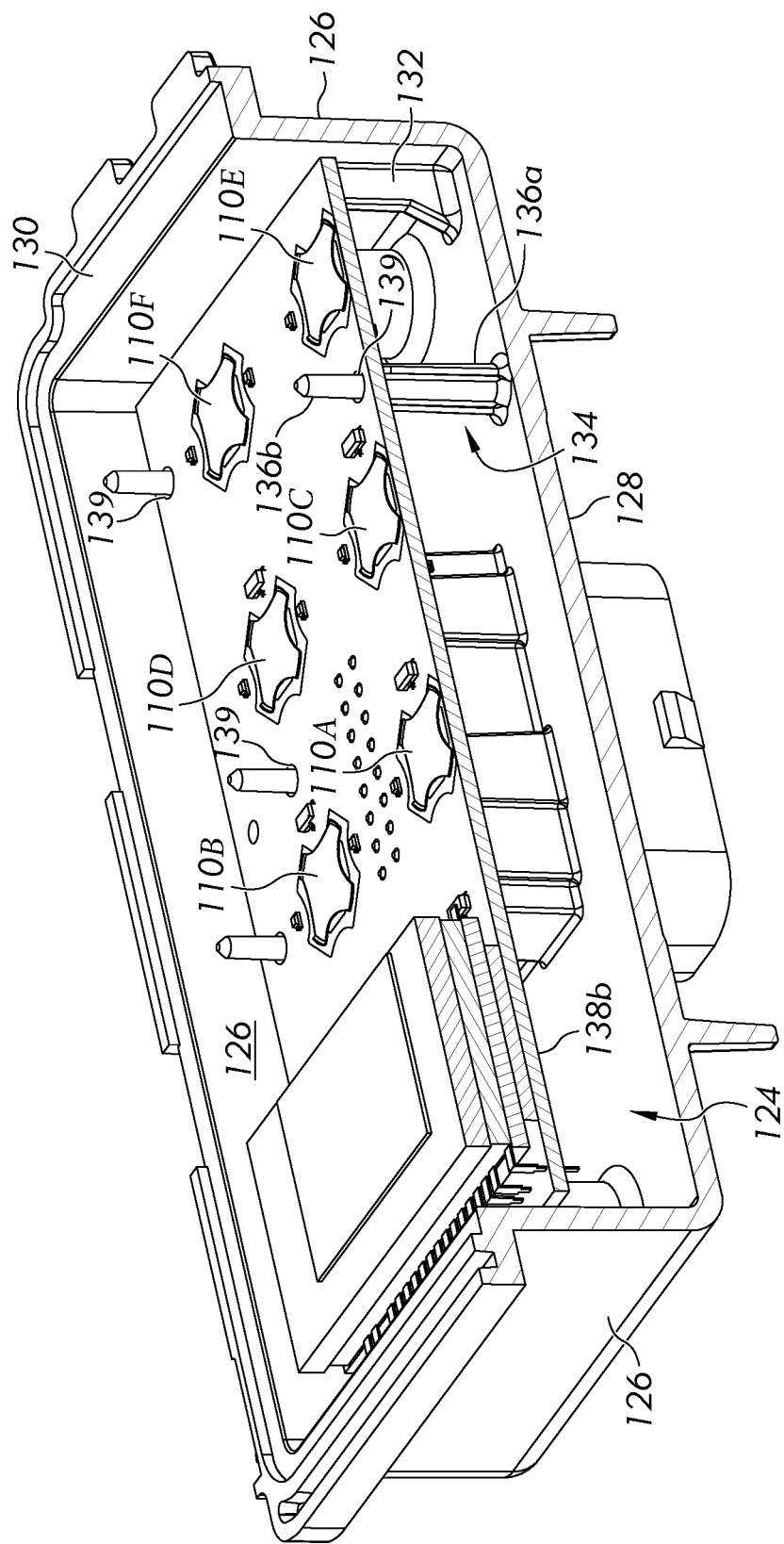
FIG. 3 is a cross-sectional view of an inside of a housing of the dual push button switch assembly show in FIG. 1, shown with a keypad, a holder and actuators of the assembly removed, taken along the line 3-3 in FIG. 1.

As further shown in FIGS. 2 and 3, the housing 104 includes a plurality of walls that collectively define an inner space 124. Specifically, the housing 104 includes at least one side wall 126 extending outwards and away from a bottom wall 128 (best shown in FIG. 3) in a perpendicular direction thereto. The depicted embodiment of the dual push button switch assembly 100 shows the housing 104 with an elongated, rectangular shape wherein the housing 104 includes four side walls 126; however, it is it be understood that the housing 104 may have any shape with any number of side walls 126.

As shown, the side walls 126 of the housing 104 define an open top, however it is to be understood that the side walls 126 need not define a completely open top. Further, the housing 104 includes an external peripheral flange 130 formed on the side walls 126 and extending outwards and away from the inner space 124 of the housing 104. Specifically, the external peripheral flange 130 is formed to accept the gasket 116 therein in order to create the aforementioned seal between the housing 104 and the keypad 102.

Moreover, at least one ledge 132 extends inwards (i.e., into the inner space 124) from at least one of the side walls 126 of the housing 104. For example, as shown in FIG. 2, a plurality of ledges 132 extend inwards from the side walls 126 of the housing 104. Further, each ledge 132 extends from the bottom wall 128 of the housing 104 towards the external peripheral flange 130, and preferably extends about halfway therebetween. While FIG. 2 depicts a plurality of ledges 132 extending inwards from multiple side walls 126 of the housing 104, it is contemplated that only a single ledge 132 may be provided wherein the single ledge 132 is a continuous ledge that extends about a periphery of the inner space 124 from each of the side walls 126 of the housing 104. Further, the ledges 132 are shown as formed integral with the housing 104 (i.e., formed simultaneously during a single manufacturing operation). However, it is contemplated that the ledges 132 may be formed separate and distinct form the housing 104 and subsequently secured thereto.

Further still, the housing 104 includes at least one locating pin 134 extending outwards and away from the bottom wall 128 of the housing 104. The locating pin 134 is generally cylindrical in shape and comprises a first section 136a and a second section 136b. The first section 136a extends outwards (e.g., directly) from the bottom wall 128 of the housing 104, and the second section 136b extends outwards and away from a distal end of the first section 136a. As shown, the first section 136a has a diameter that is greater than that of the second section 136b. In this manner, an annular surface of the distal end of the first section 136a is configured to support a member thereon (e.g., the printed circuit board 106, as will be further detailed below).

As shown, the entire locating pin 134 is formed integral with the housing 104 (i.e., formed simultaneously during a single manufacturing operation). However, it is contemplated that only one of the first and second sections 136a, 136b may be formed integral with the housing 104, or even that neither of the first or second sections 136a, 136b may be formed integral with the housing 104. Further still, the locating pin 134 need not have the aforementioned first and second sections 136a, 136b. For example, the locating pin 134 can be conically shaped, wherein a diameter at the base of the locating pin 134 (i.e., the portion of the locating pin 134 closest to the bottom wall 128 of the housing 104) is greater than a diameter at the terminal end of the locating pin 134, wherein the diameter of the locating pin 134 gradually decreases from the base to the terminal end of the locating pin 134.

With reference to FIG. 2, the printed circuit board 106 is shown as having a flat, generally rectangular shape, generally corresponding with the dimensions of the inner space 124 of the housing 104. However, it is to be understood that the printed circuit board 106 may have any shape and/or any configuration based on the available space within the housing 104, as commonly known in the art. The printed circuit board 106 has a first surface 138a and an opposite, second surface 138b. A plurality of locating apertures 139 (i.e., through-holes) are formed in the printed circuit board 106.

In the embodiment shown, an electronic display 140 (e.g., liquid crystal display, light-emitting diode display, etc.) is provided on the first surface 138a of the printed circuit board 106. Moreover, as will be further discussed below, a plurality of first switches 142A-142F and a plurality of second switches 144A-144F are likewise provided on the first surface 138a of the printed circuit board 106. That is, the electronic display 140, the plurality of first switches 142A-142F, and the plurality of second switches 144A-144F are all electrically connected on and to the printed circuit board 106 at the first surface 138a thereof. More specifically, each of the plurality of first switches 142A-142F can be a dome sensor and each of the plurality of second switches 144A-144F can be a hall sensor, as will be further detailed below.

Figure 4:
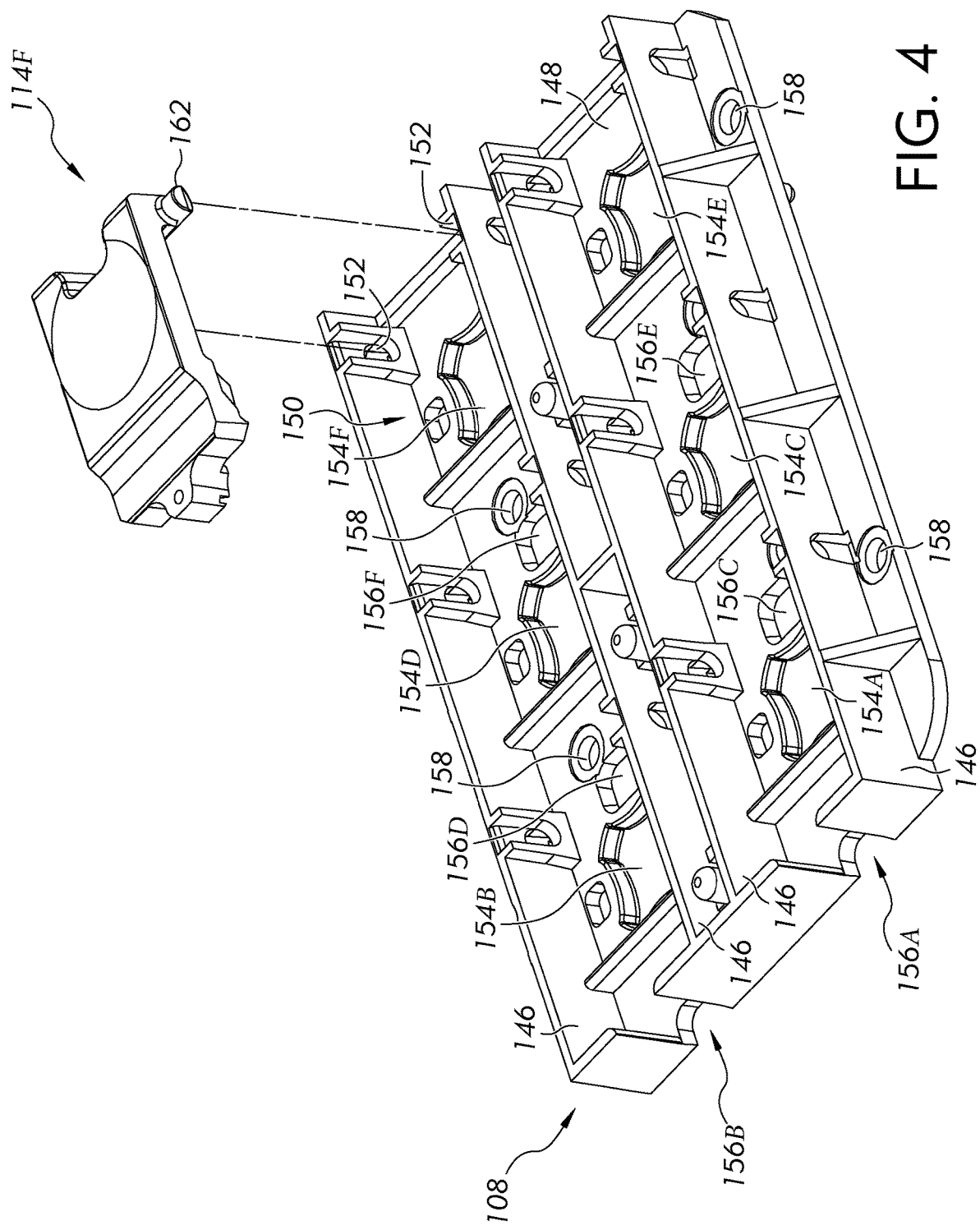
FIG. 4 is an exploded view of a holder and an actuator of the dual push button switch assembly of FIG. 2.

The holder 108 is shown in FIG. 2 as having a generally rectangular shape, however, it is further contemplated that the holder 108 may have any general shape based on the space available in the housing 104. As best shown in FIG. 4, the holder 108 includes a plurality of walls 146 and a bottom wall 148 that collectively define an inner space 150 of the holder 108. Specifically, the walls 146 are perpendicular to the bottom wall 148 and extend outwards and away therefrom. However, it is contemplated that the walls 146 need not be perpendicular to the bottom wall 148 (i.e., an angle between any one of the walls 146 and the bottom wall 148 can be acute or obtuse). The inner space 150 of the holder 108 is partitioned into individual compartments; however, it is also contemplated that the inner space 150 need not be partitioned.

The holder 108 includes at least one pivot slot 152 disposed on one of the walls 146 thereof. Specifically, the pivot slot 152 is shown as being a U-shaped channel. In the embodiment shown in FIG. 4, at least one pair of pivot slots 152 are formed on a pair of opposing walls 146 of the holder 108, respectively. Each pivot slot 152 of the pair of pivot slots 152 are arranged such that one pivot slot 152 of the pair of pivot slots 152 faces the other. That is, the pair of pivot slots 152 are aligned to define a pivot axis for a single actuator (e.g., actuator 114F shown in FIG. 4) of the plurality of actuators 114A-114F, as described in detail below. Moreover, each of the pivot slots 152 is shown as being formed integral with one of the walls 146 of the holder 108 (i.e., manufactured from the same material during a single forming process). However, it is further contemplated that the pivot slots 152 can be separate and distinct elements with respect to the holder 108, wherein the pivot slots 152 are subsequently secured thereto.

The holder 108 further includes a plurality of first through-holes 154A-154F, a plurality of second through-holes 156A-156F, and a plurality of third through-holes 158 that are formed in the bottom wall 148 thereof. That is, each of the first, second, and third plurality of through-holes 154A-154F, 156A-156F, 158 is an aperture extending completely through the bottom wall 148 of the holder 108.

Moving back to FIG. 2, the plurality of resilient domes 110A-110F are disposed within the inner space 124 of the housing 104, and more specifically, positioned on a surface of the printed circuit board 106, as described further below. The plurality of resilient domes 110A-110F are all shown as comprising the same basic configuration. Specifically, each of the resilient domes 110A-110F is spherically shaped and is comprised of an elastic material. That is, the resilient domes 110A-110F are configured to provide a biasing force and to move (i.e., deform) between a first normal position (i.e., not deformed) and a second depressed position (i.e., deformed) when a force is applied to the resilient domes 110A-110F, as will be further detailed below.

As further shown in FIG. 2, the plurality of actuators 114A-114F are all shown as comprising the same basic configuration. As such, for simplicity, the below disclosures will be made to only a single actuator 114F but it is contemplated that the other actuators 114A-114E may be identical to actuator 114F. With respect to FIG. 5, the actuator 114F has a rectangular shaped body with a top surface 160 and at least one pivot pin 162 disposed at a lateral end thereof. Each pivot pin 162 is generally cylindrical in shape and extends outwards and away from a side of the body. The depicted actuator 114F comprises two pivot pins 162 that extend outwards and away from opposing sides of the body. However, it is contemplated that the actuator 114F can have only a single, continuous pivot pin 162, formed of a single piece that extends outwards, beyond the opposing sides of the body. Moreover, the pivot pins 162 are shown as being formed integral with the body of the actuator 114F. However, it is further contemplated that the pivot pin(s) 162 can be separate and distinct from the body of the actuator 114F and subsequently attached thereto.

The actuator 114F further includes a foot 164 which extends outwards from the body in a direction opposite and away from the top surface 160. The foot 164 is shown as being formed integral with the body of the actuator 114F. However, it is contemplated that the foot 164 may be separate and distinct from the body and subsequently secured thereto. Moreover, a distal end of the foot 164 is shown as having a rounded tip. Alternatively, the distal end of the foot 164 may have other geometric configurations (e.g., pointed tip, planar edge, etc.). At the end of the body, opposite from the pivot pins 162, the actuator 114F includes an aperture 166 (i.e., a through-hole) formed therein. That is, the aperture 166 is formed in an end of the body of the actuator 114F distal from (i.e., opposite to) the pivot pins 162. The aperture 166 is dimensioned and contoured to receive one of the magnetic elements 112A-112F.

With respect to FIG. 2, the magnetic elements 112A-112F are all depicted as cylindrically-shaped magnets. However, it is contemplated that the magnetic elements 112A-112F may have a different configuration (e.g., cube, sphere, etc.) and even that each magnetic element 112A-112F may have a different configuration with respect to the other magnetic elements 112A-112F. As will be discussed further below, the number of magnetic elements 112A-112F depends on the number of the plurality of actuators 114A-114F.

During assembly, the printed circuit board 106 is inserted into the inner space 124 of the housing 104. Specifically, as shown in FIG. 3, the printed circuit board 106 is inserted such that each of the locating pins 134 is inserted into a respective one of the locating apertures 139 formed in the printed circuit board 106. In this manner, the printed circuit board 106 is quickly and correctly positioned within the inner space 124 of the housing 104. Moreover, in a completely installed position, the second surface 138b of the printed circuit board 106 rests on and is supported by the annular surface of the first section 136a of each locating pin 134. As further shown, the second surface 138b of the printed circuit board 106 rests on and is supported by the plurality of ledges 132.

Moreover, as described above, each of the resilient domes 110A-110F is disposed on the first surface 138a of the printed circuit board 106 and is positioned in a covering manner with respect to a respective one of the plurality of first switches 142A-142F. That is, each resilient dome 110A-110F is disposed on the first surface 138a of the printed circuit board 106 wherein a respective one of the plurality of first switches 142A-142F is disposed between the first surface 138a and the respective resilient dome 110A-110F such that the first switches 142A-142F are covered by the resilient domes 110A-110F.

Figure 5:
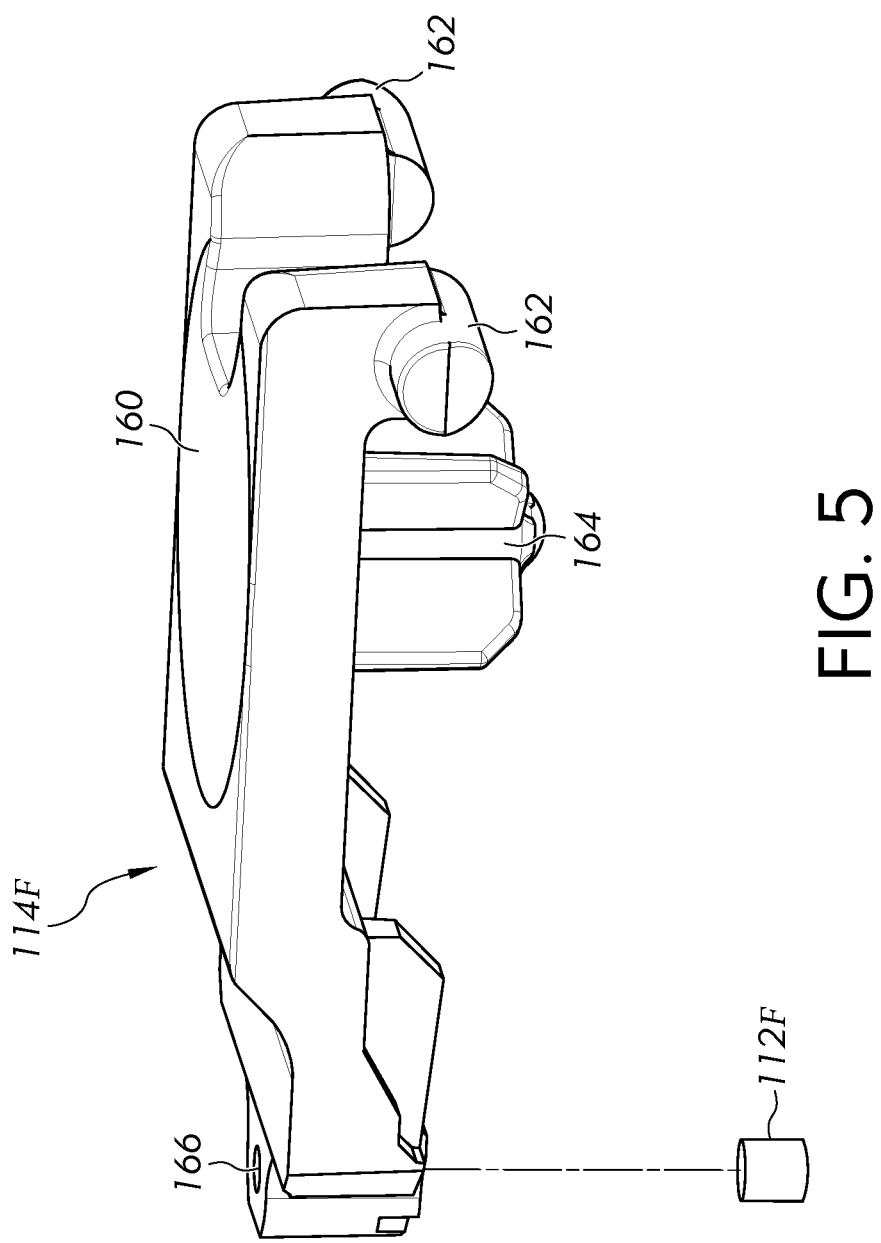
FIG. 5 is an enlarged, perspective view of an actuator and a magnetic element of the dual push bottom switch assembly of FIG. 2.

Each of the magnetic elements 112A-112F is secured to a specific actuator of the plurality of actuators 114A-114F. For example, as shown in FIG. 5, the magnetic element 112F is inserted into the aperture 166 formed in the actuator 114F and is held therein via conventional means (e.g., press-fit, adhesives, etc.). Alternatively, each of the actuators 114A-114F may be formed or molded around a specific one of the magnetic elements 112A-112F such that the actuators 114A-114F are formed and the magnetic elements 112A-112F are respectively secured thereto during a simultaneous manufacturing process. In the depicted embodiment, each of the magnetic elements 112A-112F is at least partially surrounded by its respective actuator 114A-114F. That is, a circumferential side surface of each of the magnetic elements 112A-112F is surrounded by its respective actuator 114A-114F whereas top and bottom surfaces of the magnetic elements 112A-112F are exposed. However, it is contemplated that the top and bottom surfaces of the magnetic elements 112A-112F need not be exposed.

Each of the actuators 114A-114F is positioned within the inner space 150 of the holder 108. Further, each of the actuators 114A-114F is secured to the holder 108 in an identical manner but only a single actuator 114F, as shown in FIG. 4, will be described below. The actuator 114F is first aligned with the holder 108 such that the pivot pins 162 are positioned above the pivot slots 152 of the holder 108. The actuator 114F is then inserted into the inner space 150 of the holder 108 such that the pivot slots 152 engage (e.g., partially surround) the pivot pins 162, respectively, in order to permit the actuator 114F to pivot with respect to the holder 108 between first and second positions, as will be further discussed below. In particular, the actuator 114F pivots about the pivot axis defined by the pair of pivot slots 152, as briefly mentioned above. It is contemplated that the pivot pins 162 may be received into the corresponding pivot slots 152 in a snap-fit manner to prevent the actuator 114F from inadvertently falling out of the pivot slots 152.

After the actuators 114A-114F are positioned within the inner space 150 of the holder 108, the holder 108 is installed within the inner space 124 of the housing 104 such that the holder 108 is positioned adjacent the printed circuit board 106. It is also contemplated that the actuators 114A-114F may be positioned in the holder 108 after the holder 108 is positioned in the housing 104. Specifically, in an installed position, the first surface 138a of the printed circuit board 106 faces the bottom wall 148 of the holder 108.

Initially, the holder 108 is positioned in the inner space 124 of the housing 104 in a manner wherein each of the plurality of third through-holes 158 formed in the bottom wall 148 thereof is aligned with a respective one of the locating pins 134. Thereafter, the holder 108 is inserted into the inner space 124 of the housing 104 such that each of the plurality of third through-holes 158 accepts the respective one of the locating pins 134. In this manner, the holder 108 is quickly and correctly positioned within the inner space 124 of the housing 104.

The holder 108 may be supported by the printed circuit board 106 and/or the locating pins 134. Specifically, the holder 108 may be configured to rest directly on the first surface 138a of the printed circuit board 106. Additionally and/or alternatively, the holder 108 may be configured to rest on the locating pins 134. For example, the plurality of third through-holes 158 may all have a diameter that is slightly less than that of a bottom portion of the second section 136b of the locating pins 134. In this manner, the holder 108 rests on and is supported by the locating pins 134.

Figure 6A:
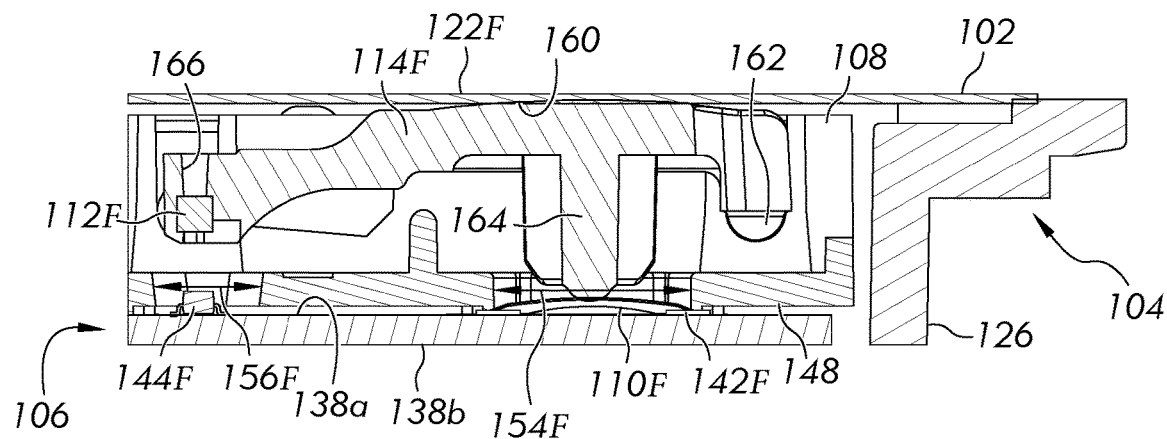
FIG. 6A is a cross-sectional view of a portion of the dual push button switch assembly of FIG. 2 showing an elastic button in a first, unactuated position.

As is best shown in FIG. 6A, in an installed position, the holder 108 is disposed within the inner space 124 of the housing 104 such that the resilient dome 110F is peripherally surrounded by the first through-hole 154F formed in the bottom wall 148 of the holder 108. In this manner, the resilient dome 110F extends into the first through-hole 154F. Moreover, in the installed position, the second switch 144F (i.e., a hall sensor) is positioned within the second through-hole 156F formed in the bottom wall 148 of the holder 108. That is, the holder 108 is disposed adjacent the printed circuit board 106 such that the second switch 144F extends into and is peripherally surrounded by the second through-hole 156F.

Figure 6B:
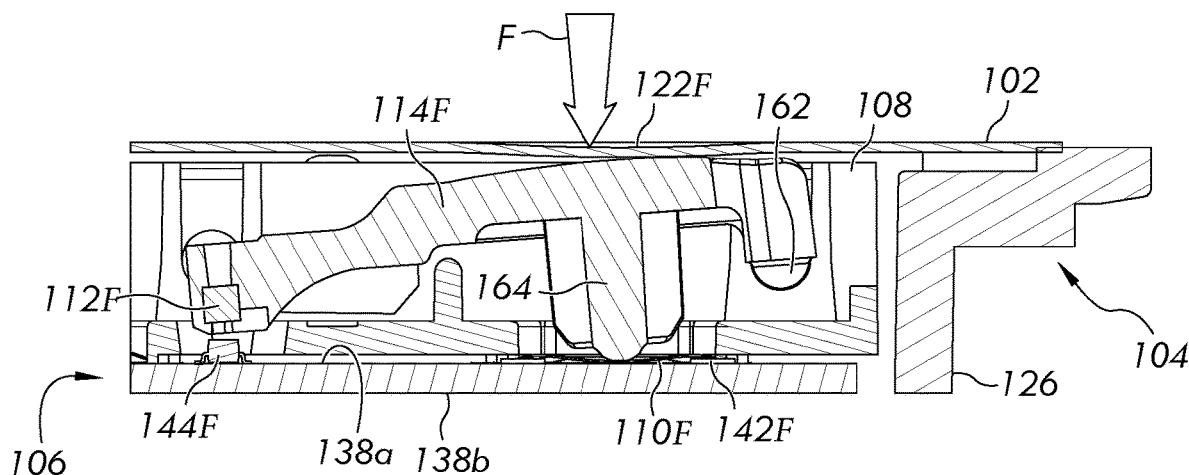
FIG. 6B is a cross-sectional view of a portion of the dual push button switch assembly of FIG. 2 showing the elastic button in a second, actuated position.

Further, in the installed position, the foot 164 of the actuator 114F extends through the first through-hole 154F and contacts the resilient dome 110F. Specifically, the rounded tip of the foot 164 directly contacts a top surface of the resilient dome 110F. In this manner, as will be further discussed below, the resilient dome 110F biases the actuator 114F into the first position, as shown in FIG. 6A. Moreover, the foot 164 of the actuator 114F also contacts the resilient dome 110F when the actuator 114F is in the second position, as shown in FIG. 6B. Said differently, in either the first position or the second position of the actuator 114F (or any position therebetween), the foot 164 contacts the resilient dome 110F.

Briefly moving back to FIG. 2, after the holder 108 is positioned within the inner space 124 of the housing 104, the gasket 116 is installed on the housing 104. Specifically, the gasket 116 engages the external peripheral flange 130 of the housing 104. Thereafter, the keypad 102 is positioned over the gasket 116 and secured to the housing 104 by conventional means (e.g., adhesives, screws, etc.). That is, in the installed position, the keypad 102 is positioned over the open top of the housing 104 and secured thereto so as to close the inner space 124 of the housing 104.

As shown in FIGS. 6A and 6B, whether the actuator 114F is in the first position or the second position, the elastic button 122F is disposed adjacent the top surface 160 of the actuator 114F. More specifically, in either the first position or the second position, the elastic button 122F directly contacts the top surface 160 of the actuator 114F. Lastly, if the dual push button switch assembly 100 includes a faceplate, the faceplate is positioned over the keypad 102 and secured to the housing 104 via conventional means (e.g., adhesives, screws, snap-fit connection, etc.).

The keypad 102 is positioned relative to the housing 104 in the installed position such that each elastic button 122A-122F is associated with a designated actuator 114A-114F. In turn, each actuator 114A-114F is associated with a designated resilient dome 110A-110F, a designated first switch of the plurality of first switches 142A-142F, and a designated second switch of the plurality of second switches 144A-144F.

It is to be understood that the foregoing steps of assembling the dual push button switch assembly 100 are not required to be completed in the order discussed above. That is, it is contemplated that the various elements of the dual push button switch assembly 100 may be assembled in an order different from that discussed above.

The dual push button switch assembly 100 will now be described with respect to operation of the same. Each of the elastic buttons 122A-122F is configured to be depressed (i.e., actuated) by a user. That is, each of the elastic buttons 122A-122F is moveable between a first, unactuated position (as shown in FIG. 6A) and a second, actuated position (as shown in FIG. 6B). Moving one of the elastic buttons 122A-122F from the first, unactuated position to the second, actuated position places the vehicle in a specific operating mode. For example, the elastic button 122A may place a motor vehicle in a reverse mode, the elastic button 122B may place the vehicle in a neutral mode, the elastic button 122C may place the vehicle in a drive mode, the elastic button 122D may place the vehicle in a park mode, and the elastic buttons 122E, 122F may place the vehicle in a special mode. It is to be understood that the elastic buttons 122A-122F may be associated with a function other than placing the vehicle in a specific operating mode. That is, the elastic buttons 122A-122F may be directed towards in-cabin functionality or any other function associated with the vehicle. For simplicity, unless otherwise stated, the below disclosure is made with respect to only a single elastic button 122F and the respective components associated therewith.

With respect to FIG. 6A, the elastic button 122F is shown in the first, unactuated position, the resilient dome 110F is shown in the first normal position (i.e., not deformed), and the actuator 114F is shown in the first position. The resilient dome 110F biases the actuator 114F towards the first, unactuated position such that, absent a predetermined force applied to the actuator 114F (as will be further detailed below), the resilient dome 110F remains in the first normal position (i.e., not deformed) and thus the actuator 114F remains in the first, unactuated position. That is, when the elastic button 122F is in the first, unactuated position, the foot 164 of the actuator 114F rests on and is supported by the top surface of the resilient dome 110F in a manner wherein the resilient dome 110F is not deformed (i.e., the first normal position, where it maintains its generally spherical shape).

As briefly discussed above, the first switch 142F comprises a dome sensor. As such, the first switch 142F (i.e., the dome sensor) is activated when the resilient dome 110F is deformed. Specifically, as is conventionally known in the art and shown in FIG. 2, the first switch 142F comprises an outer trace 143a disposed on the first surface 138a of the printed circuit board 106. In the shown embodiment, the outer trace 143a at least partially surrounds a center pad 143b. In operation, when the resilient dome 110F is in the first normal position (i.e., not deformed), the resilient dome is held in contact with the outer trace 143a and is spaced from the center pad 143b. When the resilient dome 110F is in the second depressed position (i.e., deformed), an underside of the resilient dome 110F contacts the center pad 143b, thus completing the circuit between the outer trace 143a and the center pad 143b.

Moreover, the second switch 144F comprises a hall sensor that senses a magnetic field of a predetermined strength or a predetermined change in a magnetic field generated by the magnetic element 112F. When the hall sensor senses the foregoing magnetic field or change in the magnetic field, the second switch 144F is activated.

It is to be understood that activation of both the first and second switches 142F, 144F confirms the desire of the user to perform the function associated with the corresponding button 112F. That is, activation of the first switch 142F and activation of the second switch 144F are both indicative of the user actuating the elastic button 122F so as to select the function associated with the elastic button 122F. In this manner, a safety feature is provided in that the first and second switches 142F, 144F provide redundancy through two independent methods, as will now be detailed below.

Turning now to FIG. 6B, the elastic button 122F is shown in the second, actuated position, the resilient dome 110F is shown in the second depressed position (i.e., deformed), and the actuator 114F is shown in the second position. When a user wishes to select the function associated with the elastic button 122F, the user applies a force F to (e.g. presses) the elastic button 122F to cause the elastic button 122F to move in a direction towards the inner space 124 of the housing 104. Specifically, in order to cause the elastic button 122F to move the force F must be great enough to overcome the resiliency of the elastic button 122F and an initial, maximum force generated via the configuration of the resilient dome 110F (e.g., biasing of the resilient dome 110F). As the force F is applied, the elastic button 122F elastically deforms and transitions from the first, unactuated position to the second, actuated position.

As the elastic button 122F moves from the first, unactuated position toward the second, actuated position, the force F is transmitted to the actuator 114F. The force F transmitted to the actuator 114F causes the actuator 114F to move (i.e., pivot via the engagement between the pivot slots 152 and the pivot pins 162) while the foot 164 simultaneously moves (i.e., deforms) the resilient dome 110F to the second depressed position. Specifically, as the actuator 114F pivots, the foot 164 both deforms the resilient dome 110F and slides across the top surface thereof. Once the actuator 114F has reached the second position the first switch 142F is activated. Specifically, the second position can be when the foot 164 bottoms-out or contacts (i.e., indirectly via the resilient dome 110F) the first surface 138a of the printed circuit board 106. Alternatively, the second position can be slightly before the foot 164 bottoms-out against the printed circuit board 106.

Moreover, as the actuator 114F pivots from the first position towards the second position, the second switch 144F (i.e., the hall sensor) senses a change in the magnetic field of the magnetic element 112F. More specifically, the second switch 144F senses the change in the magnetic field when the actuator 114F reaches a predetermined position (e.g., the second position). Of note, the change in the magnetic field being sensed may be an overall intensity of the magnetic field with respect to the second switch 144F (i.e., the hall sensor). For example, the second switch 144F may sense a weaker magnetic field when the actuator 114F is in the first position and may sense a stronger magnetic field when the actuator 114F reaches a predetermined position (e.g., the second position). Alternatively, the change in the magnetic field being sensed may be a presence and/or an absence of the magnetic field. For example, the second switch 144F may sense no magnetic field when the actuator 114F is in the first position and may sense a presence of the magnetic field of the magnetic element 112F when the actuator 114F reaches a predetermined position (e.g., the second position).

This change in the magnetic field is indicative of the user actuating the elastic button 122F so as to select the function associated with the elastic button 122F. Thus, when the change in the magnetic field is sensed, the second switch 144F is activated.

Of note, when the first and second switches 142F, 144F are activated, signals may be sent to a controller 145 (shown schematically in FIG. 1) which, in turn, oversees activation of the intended function. Of note, while the controller 145 is shown schematically in FIG. 1 as being internal to the dual push button switch assembly 100, it is also contemplated that the controller 145 may be external to the dual push button switch assembly 100 (e.g., the controller 145 may be part of the vehicles engine control system/unit). Moreover, the actuator 114F is preferably configured such that, as the actuator 114F pivots from the first positon towards the second position, the first and second switches 142F, 144F are both activated simultaneously.

As briefly mentioned above, the applied force F must be great enough to overcome the initial, maximum force generated via the biasing force of the resilient dome 110F. This initial, maximum force occurs when the actuator 114F is in the first position. That is, the initial, maximum force occurs when the foot 164 of the actuator 114F rests on the top surface of the resilient dome 110F without the resilient dome 110F being deformed. The sudden overcoming of the initial, maximum force generated via the biasing force of the resilient dome 110F provides a tactile haptic response to the elastic button 122F which, in turn, is imparted to the user. In this manner, the user is made aware that the function associated with the elastic button 122F has been selected and will begin operation.

As mentioned above, while the first and second switches 142F, 144F are preferably both activated simultaneously, this need not be the case. That is, the second switch 144F (i.e., the hall sensor) may activate slightly before the first switch 142F (i.e., the dome sensor). For example, as the actuator 114F pivots from the first position towards the second position 114, the second switch 144F (i.e., the hall sensor) may sense a change in the magnetic field of the magnetic element 112F prior to the actuator 114F reaching the second position (i.e., prior to the dome switch being activated). In this instance, the controller 145 may receive a signal indicative of the second switch 144F being activated, but may not initiate the operating mode associated with the elastic button 122F until the first switch 142F is activated and the controller receives a signal indicative of the same.

After the user receives the tactile haptic response imparted by the elastic button 122F, the user may disengage the elastic button 122F such that the force F is no longer applied thereto. Due to the biasing force of the resilient dome 110F, and because there is no external force acting against the biasing force of the resilient dome 110F, the actuator 114F pivots back towards the first position, and the elastic button 122F transitions back to the first, unactuated position.

Of note, the strength of the tactile haptic response provided to the elastic button 122F is dependent on the configuration (e.g., material selection, thickness, diameter, height, etc.) of the resilient dome 110F. Accordingly, to enhance functionality of the dual push button switch assembly 100, each of the elastic buttons 122A-122F may impart a tactile haptic response of a different strength. As such, the user may readily know, based on the strength of the tactile haptic response provided by the elastic button 122F, if the elastic button 122F intended to be actuated was indeed actuated. Alternatively, each of the elastic buttons 122A-122F may impart the same strength tactical haptic response.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims.

What is claimed is:

1. A dual push button switch assembly for a vehicle, the dual push button switch assembly comprising:
   a housing having a plurality of walls that collectively define an inner space;
   an elastic button being moveable between a first unactuated position and a second actuated position relative to the housing;
   a holder disposed in the housing and comprising a plurality of walls, wherein at least one pivot slot is formed integral with a wall of the plurality of walls of the holder, and first and second through-holes are formed in a bottom of the holder;
   a printed circuit board positioned within the housing and disposed adjacent the holder;
   a first switch comprising a dome sensor disposed on a surface of the printed circuit board and peripherally surrounded by the first through-hole;
   a second switch comprising a hall sensor disposed on the surface of the printed circuit board and extending into the second through-hole;
   a resilient dome disposed on the surface of the printed circuit board and located adjacent to the dome sensor, the resilient dome extending into the first through-hole, and the resilient dome being moveable between a first normal position and a second depressed position;
   an actuator positioned between the elastic button and the resilient dome and pivotable between a first position corresponding to the first unactuated position of the elastic button and the first normal position of the resilient dome and a second position corresponding to the second actuated position of the elastic button and the second depressed position of the resilient dome, the actuator comprising a foot extending outwards therefrom and at least one pivot pin that engages the at least one pivot slot so as to pivot the actuator, wherein the resilient dome biases the actuator towards the first position; and
   a magnetic element positioned on an end of the actuator opposite from the at least one pivot pin,
   wherein the elastic button is moved towards the second actuated position when a predetermined force applied to the elastic button is transmitted to the actuator, and
   wherein as the actuator pivots from the first position towards the second position, the foot slides across a surface of the resilient dome and moves the resilient dome to the second depressed position, thereby activating the first switch, and the hall sensor senses a change in the magnetic field of the magnetic element, thereby simultaneously activating the second switch.

2. The dual push button switch assembly of claim 1, wherein each of the first and second through-holes is an aperture extending completely through the bottom of the holder, and wherein the first and second through-holes are discrete from each other.

3. The dual push button switch assembly of claim 1, wherein the foot contacts the resilient dome when the actuator is in the first position and the second position.

4. The dual push button switch assembly of claim 1, wherein the housing comprises a ledge extending inwards from at least one wall of the plurality of walls of the housing, and wherein the printed circuit board rests on the ledge of the housing.

5. The dual push button switch assembly of claim 1, wherein the actuator further comprises a top surface, and wherein the elastic button is disposed adjacent the top surface of the actuator.

6. The dual push button switch assembly of claim 5, wherein the elastic button directly contacts the top surface of the actuator when the actuator is in the first position and the second position.

* * * * *